United States Patent
Severson et al.

(10) Patent No.: US 10,887,979 B2
(45) Date of Patent: Jan. 5, 2021

(54) LOW CYCLE FATIGUE PREVENTION

(71) Applicant: Hamilton Sundstrand Corporation, Charlotte, NC (US)

(72) Inventors: Mark Hamilton Severson, Rockford, IL (US); Ryan W. Schmid, Rockford, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 381 days.

(21) Appl. No.: 15/866,991

(22) Filed: Jan. 10, 2018

(65) Prior Publication Data
US 2019/0215951 A1  Jul. 11, 2019

(51) Int. Cl.
*G01N 25/72* (2006.01)
*H05K 1/02* (2006.01)
(Continued)

(52) U.S. Cl.
CPC ......... *H05K 1/0212* (2013.01); *G01R 31/008* (2013.01); *G01R 31/2849* (2013.01); *G01R 31/2875* (2013.01); *G01R 31/71* (2020.01); *H01L 23/345* (2013.01); *H05B 3/265* (2013.01); *H05K 1/0271* (2013.01); *H05K 3/34* (2013.01); *H05K 2201/068* (2013.01); *H05K 2201/10151* (2013.01); *H05K 2201/10159* (2013.01)

(58) Field of Classification Search
CPC .............................. B23K 1/0014; B23K 3/087
See application file for complete search history.

(56) References Cited

U.S. PATENT DOCUMENTS 5,208,528 A * 5/1993 Quintard .............. G01R 31/309
                                                      250/330
5,867,809 A   2/1999 Soga et al.
(Continued)

FOREIGN PATENT DOCUMENTS

JP           6156904 A      6/1994

OTHER PUBLICATIONS

Euopean Patent Office, Extended European Search Report, Application No. 19150912.4-1203, dated Jun. 12, 2019 (17 pages).

*Primary Examiner* — Lisa M Caputo
*Assistant Examiner* — Nasir U. Ahmed
(74) *Attorney, Agent, or Firm* — Cantor Colburn LLP

(57) ABSTRACT

A system for reducing low cycle fatigue of a soldered connection includes a controller and a heating element operatively connected to the controller. The system also includes a printed wire board soldered in connection with an electronic component. The controller is configured to retrieve a signal indicative of a temperature of the electronic component, and compare the temperature to a stored predetermined range of operating temperatures. Responsive to determining that the temperature of the electronic component is less than a lower threshold temperature of the predetermined range of operating temperatures, the controller transmits a signal to the heating element that causes the heating element to heat the electronic component. The controller then saves, to an operatively connected computer readable memory, a magnitude of temperature difference and a number of times that magnitude is reached. The controller uses the stored information to track the life of the electronic component.

9 Claims, 3 Drawing Sheets

(51) Int. Cl.
*G01R 31/28* (2006.01)
*H05K 3/34* (2006.01)
*H01L 23/34* (2006.01)
*G01R 31/00* (2006.01)
*H05B 3/26* (2006.01)
*G01R 31/71* (2020.01)

(56) References Cited

U.S. PATENT DOCUMENTS

| | | |
|---|---|---|
| 6,114,674 A | 9/2000 | Baugh et al. |
| 6,621,055 B2 | 9/2003 | Weber |
| 8,481,897 B2 | 7/2013 | Woelfel |
| 8,869,624 B2 | 10/2014 | Schnetker et al. |
| 9,012,811 B2 | 4/2015 | White |
| 2003/0139142 A1 | 7/2003 | Wang |
| 2012/0072129 A1* | 3/2012 | Omori ............... B23K 1/00 702/34 |
| 2013/0180973 A1 | 7/2013 | White |
| 2013/0275096 A1* | 10/2013 | Yoshimura ......... G06F 30/23 703/2 |
| 2014/0198424 A1* | 7/2014 | Hugo ............... H05K 13/0465 361/104 |
| 2016/0011133 A1* | 1/2016 | Onishi ............... G01R 31/71 374/5 |

\* cited by examiner

LOW CYCLE FATIGUE PREVENTION

BACKGROUND

Exemplary embodiments pertain to the art of electronic devices, and more particularly, to prevention of low cycle fatigue in soldered connections in electronic devices.

Aircraft electronics that are located outside the pressure shell are subjected to harsh thermal environments. One of these environments is hot/cold thermal cycling created by the natural temperature/altitude environment. Ambient air 40,000 feet altitude is cold, and gets progressively colder at increased altitudes. Ambient air at or near sea level is warm or hot. Therefore, electronics that do not dissipate large amounts of heat will be warm on the ground, and get cold in flight. Other aircraft electronic installations can be subject to hot cycling due to their proximity to heat sources during flight. This hot/cold cycling is damaging to electronics because, among other reasons, the cycling causes a well-known failure mode called low cycle fatigue (LCF). LCF is a result of repeated hot/cold cycling in materials with dissimilar coefficients of thermal expansion (CTE).

Equipment engineers put great effort into matching CTE of PWB's and components to minimize LCF thermal stresses on solder created by the expansion and contraction resulting from the hot/cold cycling. The selectin process is imperfect, and considerable effort is spent selecting parts that can tolerate the large swings in temperature while matching performance and longevity characteristics unique to different materials.

BRIEF DESCRIPTION

Disclosed is a system for reducing low cycle fatigue of a soldered connection. The system includes a controller and a heating element operatively connected to the controller. The system includes a printed wire board (PWB) soldered in connection with an electronic component. The controller is configured to retrieve a signal indicative of a temperature of the electronic component, and compare the temperature to a stored predetermined range of operating temperatures. Responsive to determining that the temperature of the electronic component is less than a lower threshold temperature of the predetermined range of operating temperatures, the controller transmits a signal to the heating element that causes the heating element to raise the temperature of the electronic component. The controller then saves, to an operatively connected computer readable memory, a magnitude of temperature difference and a number of times that magnitude is reached.

Also disclosed is a computer-implemented method for reducing low cycle fatigue (LCF) in a soldered connection. The method includes retrieving, via a processor in a controller, a signal indicative of a temperature of an electronic component soldered to a printed wire board (PWB). The processor compares the temperature to a stored predetermined range of operating temperatures, and responsive to determining that the temperature of the electronic component is less than a lower threshold temperature of the predetermined range of operating temperatures, transmits a signal to a heating element that causes the heating element to raise the temperature of the electronic component. The processor then saves, to an operatively connected computer readable memory, a magnitude of temperature difference and a number of times that magnitude is reached.

Also disclosed is a computer program product for reducing low cycle fatigue, the computer program product including a computer readable storage medium having program instructions stored on it. The program instructions are executable by a processor to cause the processor to perform a method. The method includes retrieving, via a processor in a controller, a signal indicative of a temperature of an electronic component soldered to a printed wire board (PWB). The processor compares the temperature to a stored predetermined range of operating temperatures, and responsive to determining that the temperature of the electronic component is less than a lower threshold temperature of the predetermined range of operating temperatures, transmits a signal to a heating element that causes the heating element to raise the temperature of the electronic component. The processor then saves, to an operatively connected computer readable memory, a magnitude of temperature difference and a number of times that magnitude is reached.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
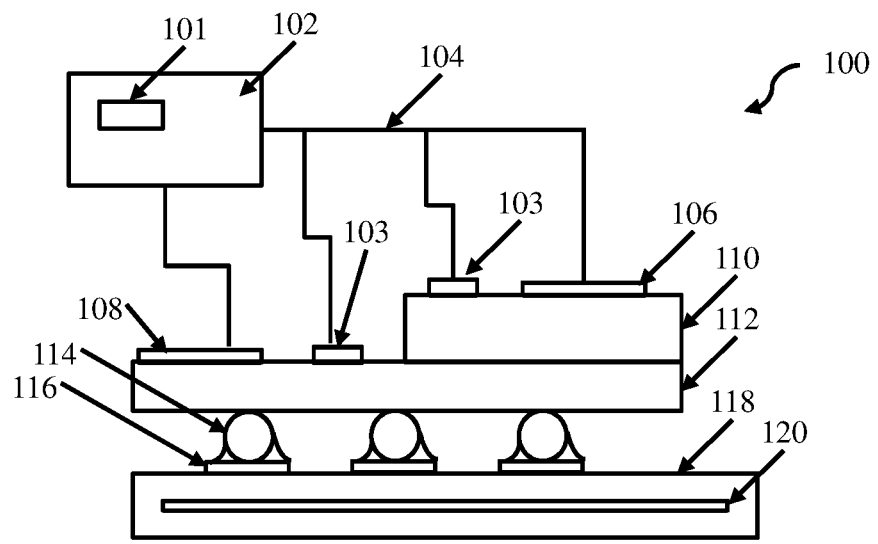
FIG. 1 is an operating environment for an LCF reducing system with a heating trace according to an embodiment.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application. For example, "about" can include a range of ±8% or 5%, or 2% of a given value.

An electronics printed wiring board (PWB) consists of a bare board populated with hundreds of parts, and sometimes many more. The bare board is constructed of copper traces and copper planes sandwiched between non-metallic laminates. This assembly expands and contracts when heated/cooled based upon the coefficient of thermal expansion (CTE) of the materials and the layup of the board. Similarly, each component on the PWB will expand and contract with heating and cooling based upon the materials used in the component. The CTE of the printed wiring board and the components are almost always different, therefore they grow and shrink at different rates and amounts at the same temperature. This non-uniform expansion and contraction between adjoining materials creates a mechanical load on the solder joints that attach the component to the board.

LCF results from temperature cycling from hot to cold. The most common approach to managing LCF is to minimize the CTE mismatches between the PWB and the components. The conventional solution may still result in CTE mismatches because of unavoidable material differences in the components and supporting structures. The LCF risk is greatest with complex mechanical packages including ball grid arrays (BGA's). Using conventional approach, when a BGA is mounted on a multi-layer PWB, electronics designers try to minimize CTE mismatches between the PWB and the component, and also try to minimize hot temperature operation by cooling the PWB. This minimizes the hot temperatures, however also causes the electronics to run colder in flight, which may still put mechanical stresses on the solder joints.

The damage to solder joints created by thermal cycling between low and high temperatures is well understood. At a high level of description, the LCF damage to the solder joints is proportionate to $N*dT^n$, where N is the number of thermal cycles (traversing from a low normal operating temperature to a high operating temperature of the component, or vice versa) during usage, dT is the difference in temperature between hot and cold operation of the component, and n is an exponent of fatigue derived from a slope graph of a solder stress to number of cycles (S–N) curve. Although the mathematics underlying LCF is known, the exercise of designing around the physical limitations of the materials at hand (and their thermal expansion) can consume a great deal of engineering time and can force designers and engineers to incorporate multiple layers of redundancy to fail-safe the electronics equipment. To increase the useful life of soldered electronic components on aircraft, it is advantageous to provide methods and apparatus to minimize the temperature differences between the hot and cold operational modes to reduce stress on the solder joints. By using a heating element to heat the component, which is contrary to conventional approaches for controlling LCF, some disclosed embodiments can maintain a dT within certain acceptable parameters, and also control the time in which the temperature varies from one extreme to another. In some aspects, an embedded heating element inside the PWB can heat multiple components simultaneously. In other aspects, individual components are heated with individual heating elements to provide locational temperature control on a single circuit board.

FIG. 1 depicts an operating environment for an LCF reducing system with an embedded trace heater 120, according to an embodiment. In one aspect, the system 100 includes a printed wire board (PWB) 118, a trace heater 120 embedded in or on the PWB 118, and a controller 102 operatively connected to the trace heater 120. By way of example, the PWB 118 is shown in connection with an electronic component 110 by at least one solder connection 114. The solder connection 114 is soldered to a PWB pad 116. A controller 102 is configured to control the trace heater 120 by sensing, via a temperature sensor 103, a temperature of the PWB and/or the electronic component 110, determining whether the sensed temperature is within a predetermined range of operating temperatures, and heating the PWB 118 with the trace heater 120 until the sensed temperature meets or exceeds a bottom threshold temperature of the predetermined range of operating temperatures. The controller 102 includes a memory 101 that saves the predetermined range of operating temperatures. An example of a predetermined range of operating temperatures is 45 degrees F. to 100 degrees F. Other ranges are contemplated.

In another embodiment, the controller 102 is operatively connected with a heating element 108 that is affixed to and heats an external portion of the PWB 118. The controller 102 may also be operatively connected to a heating element 106 that is affixed to and in direct thermal communication with the electronic component 110. For example, the heating element 106 may be securely fixed to a chip, and the controller 102 directly heats the electronic chip to meet or exceed a threshold temperature within the predetermined range of operating temperatures.

The controller 102 may heat the component 110, the PWB 118, or both, using various signal transmission techniques. In one aspect the controller 102 may heat the trace heater 120 by transmitting a series of electric pulses through the trace heater 120 with a frequency of the pulses matching a predetermined heating response that heats the trace heater 120 to a desired temperature. In another aspect, the trace heater 120 may be heated by the controller 102 using a steady flow of current that resistively heats the trace heater 120. Similarly, the heating elements 106 and 108 may be controlled by the controller 102 by heating with pulses or a steady state current.

Figure 2:
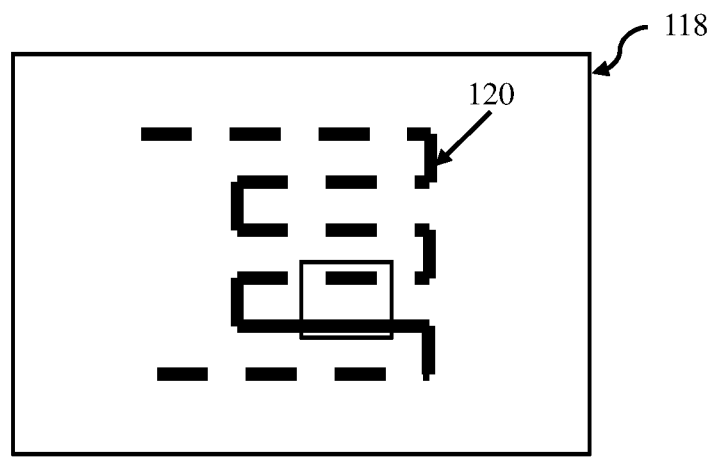
FIG. 2. is a top view of a PWB and a trace heater embedded within the PWB according to an embodiment.

FIG. 2 depicts a top view of the PWB 118, with all components shown in FIG. 1 omitted for clarity (with the exception of the trace heater 120 and the component 110 on the PWB). By embedding the trace heater 120 within the PWB, the area surrounding the component 110, and the component 110 itself, are heated with the trace heater 120. By heating the PWB directly, LCF is minimized.

According to embodiments of the present invention, LCF is minimized in the solder connections 114 by reducing the magnitude to temperature difference (dT) and number of times that magnitude is reached (N). By monitoring the number N and a magnitude of temperature difference for each count of N, the controller 102 can accumulate a cumulative dT over time, and predict the remaining life of the soldered component in service. For example, controller 102 can maintain a value saved in the memory 101 indicative of a remaining useful life. The controller 102 can also include in the evaluation of remaining service life for the component a weighted damage coefficient. The controller 102 estimates a weighted damage coefficient by monitoring extreme operating environmental factors and adjusting the weighted damage coefficient based on a predetermined relationship between the environmental factor and its known effect on the life of the part. The relationship between known environmental factors and the weighted coefficients are stored in the memory 101.

In some aspects, the controller 102 monitors and evaluates the remaining life, then provides feedback indicative of the end of a life cycle for preemptive maintenance or replacement of a component. According to one embodiment, the controller 102 transmits the continuous feedback to an operatively connected central controller (not shown for clarity) on an aircraft in which the system is operating. The central controller may output the continuous feedback, which may include a message to repair or replace the electronic component 110, the PWB, or other portions of the system 100.

Figure 3:
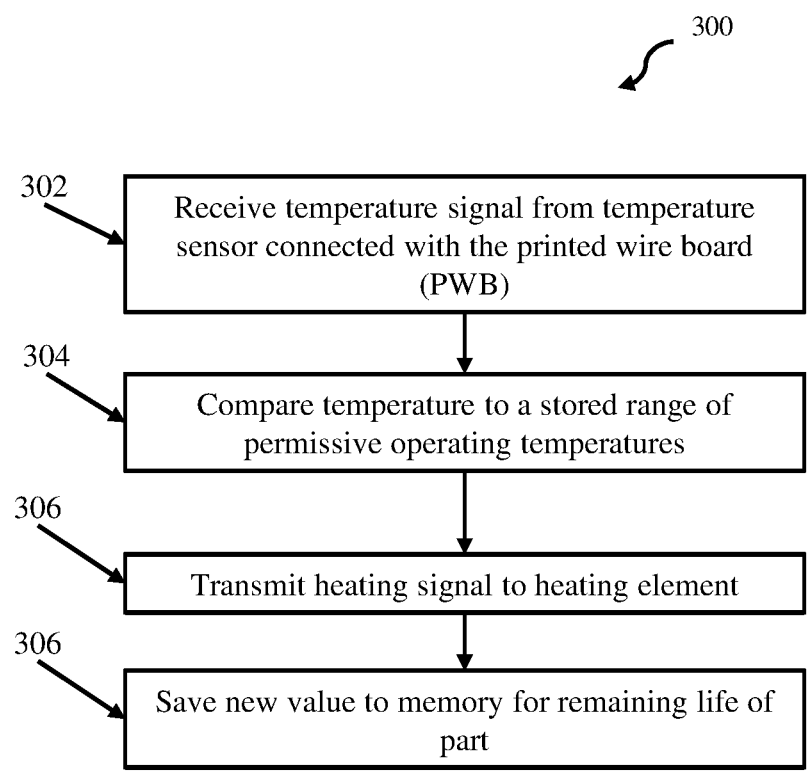
FIG. 3 is flow diagram of a computer-implemented method for reducing LCF in a soldered PWB and electronic component according to an embodiment.

FIG. 3 depicts a flow diagram of a computer-implemented method 300 for reducing low cycle fatigue (LCF) in one or more soldered connections, according to an embodiment. By way of an overview of the method 300, according to one embodiment, the controller 102 retrieves a signal from the electronic component 106 or a connected temperature sensor in thermal communication with the electronic component 106. The controller 102 retrieves the signal by transmitting a signal to the component 106 and/or the sensor, and receiving a signal response from the component and/or sensor indicative of wear and/or LCF. The controller 102 determines from the retrieved signal whether one or more retrieved values in the signal indicates potential wear or damage to the component due to extreme temperature variations, which are consistent with LCF. The controller 102 heats the electronic component 106 to a target temperature to avoid or mitigate LCF, and calculates the remaining life of the electronic component 106 after the temperature variation.

Considering the method 300 in greater detail, as shown in block 302, the controller 102 reduces LCF in a PWB soldered connection that connects the electronic component 106 with the PWB 118 by first retrieving a signal indicating a temperature of the electronic component 206.

In block 304, the controller 102 compares the temperature of the electronic component 110 to a stored range of permissive operating temperatures, and transmits a heating signal to the heating element(s) (106, 108, and/or 120).

In block 308 the controller 102 saves a new value to memory indicating a remaining life for the PWB 118 and electronic component 110.

Figure 4:
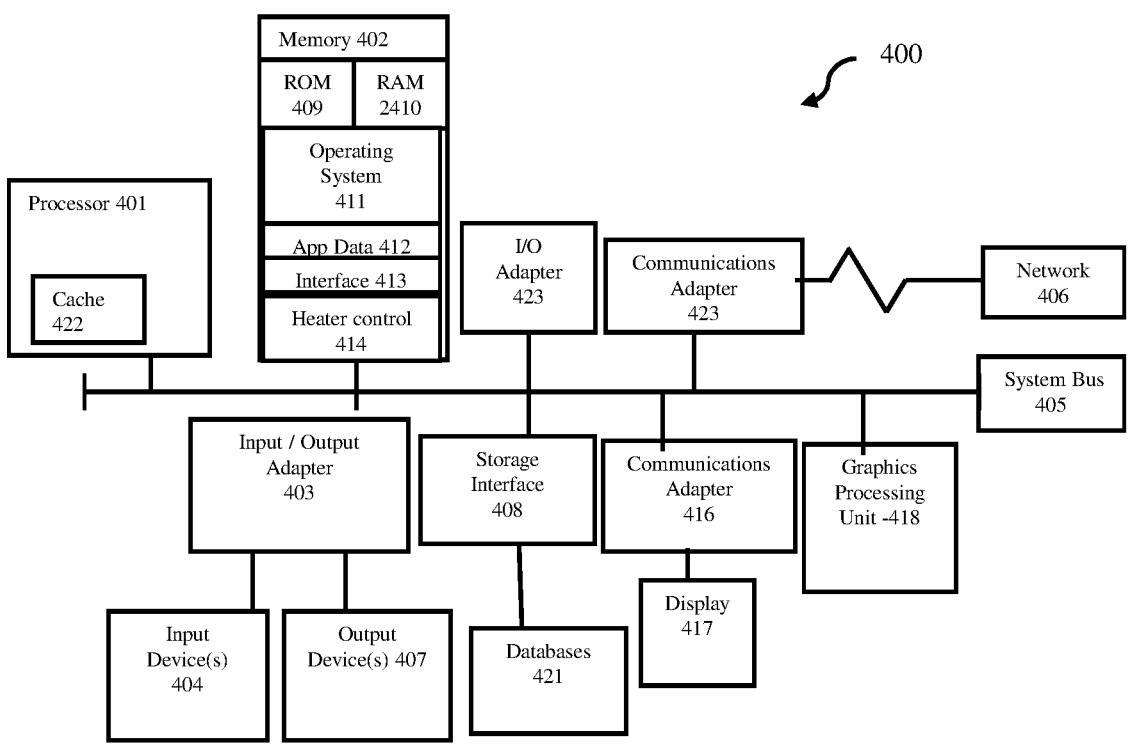
FIG. 4 is an exemplary computer system for practicing embodiments described herein.

FIG. 4 illustrates a block diagram of an exemplary computing environment and computer system 400 for use in practicing the embodiments described herein. The environment and system described herein can be implemented in hardware, software (e.g., firmware), or a combination thereof. In an exemplary embodiment, a hardware implementation can include a microprocessor of a special or general-purpose digital computer, such as a personal computer, workstation, minicomputer, or mainframe computer. Computer 400 therefore can embody a general-purpose computer. In another exemplary embodiment, the implementation can be part of a system on a chip or other computing scheme.

As shown in FIG. 4, the computer 400 includes processor 401. Computer 400 also includes memory 402 communicatively coupled to processor 401, and one or more input/output adapters 403 that can be communicatively coupled via system bus 405. Memory 402 can be communicatively coupled to one or more internal or external memory devices via a storage interface 408. Communications adapter 416 can communicatively connect computer 400 to one or more networks 406. System bus 405 can communicatively connect one or more user interfaces via input/output (I/O) adapter 403. I/O adapter 403 can connect a plurality of input devices 404 to computer 400. Input devices can include, for example, a keyboard, a mouse, a microphone, a sensor, etc. System bus 405 can also communicatively connect one or more output devices 407 via I/O adapter 403. Output device 407 can include, for example, a display, a speaker, a touchscreen, etc.

Processor 401 is a hardware device for executing program instructions (aka software), stored in a computer-readable memory (e.g., memory 101 and 402). Processor 401 can be any custom made or commercially available processor, a central processing unit (CPU), a plurality of CPUs, an auxiliary processor among several other processors associated with the computer 400, a semiconductor based microprocessor (in the form of a microchip or chip set), or generally any device for executing instructions. Controller 102 may be similar to or the same device as processor 401. Processor 401 can include a cache memory 422, which can include, but is not limited to, an instruction cache to speed up executable instruction fetch, a data cache to speed up data fetch and store, and a translation lookaside buffer (TLB) used to speed up virtual-to-physical address translation for both executable instructions and data. Cache memory 422 can be organized as a hierarchy of more cache levels (L1, L2, etc.).

Processor 401 can be disposed in communication with one or more memory devices (e.g., RAM 409, ROM 410, one or more external databases 421, etc.) via a storage interface 408. Storage interface 408 can also connect to one or more memory devices including, without limitation, one or more databases 421, and/or one or more other memory drives (not shown) including, for example, a removable disc drive, etc., employing connection protocols such as serial advanced technology attachment (SATA), integrated drive electronics (IDE), IEEE-1394, universal serial bus (USB), fiber channel, small computer systems interface (SCSI), etc. The memory drives can be, for example, a drum, a magnetic disc drive, a magneto-optical drive, an optical drive, a redundant array of independent discs (RAID), a solid-state memory device, a solid-state drive, etc. Variations of memory devices can be used for implementing, for example, list all databases from other figures.

Memory 402 can include random access memory (RAM) 409 and read only memory (ROM) 410. RAM 409 can be any one or combination of volatile memory elements (e.g., DRAM, SRAM, SDRAM, etc.). ROM 410 can include any one or more nonvolatile memory elements (e.g., erasable programmable read only memory (EPROM), flash memory, electronically erasable programmable read only memory (EEPROM), programmable read only memory (PROM), tape, compact disc read only memory (CD-ROM), disk, cartridge, cassette or the like, etc.). Moreover, memory 402 can incorporate electronic, magnetic, optical, and/or other types of non-transitory computer-readable storage media. Memory 402 can also be a distributed architecture, where various components are situated remote from one another, but can be accessed by processor 401.

The instructions in memory 402 can include one or more separate programs, each of which can include an ordered listing of computer-executable instructions for implementing logical functions. In the example of FIG. 4, the instructions in memory 402 can include an operating system 411. Operating system 411 can control the execution of other computer programs and provides scheduling, input-output control, file and data management, memory management, and communication control and related services.

The program instructions stored in memory 402 can further include application data 412, and for a user interface 413.

Memory 402 can also include program instructions for a heater control 414, configured to evaluate temperatures via a connected sensor or sensors, retrieve stored values, compare stored values to the sensed values, and transmit signals to another controller indicative of one or more values exceeding allowable limits.

I/O adapter 403 can be, for example but not limited to, one or more buses or other wired or wireless connections. I/O adapter 403 can have additional elements (which are omitted for simplicity) such as controllers, microprocessors, buffers (caches), drivers, repeaters, and receivers, which can work in concert to enable communications. Further, I/O adapter 403 can facilitate address, control, and/or data connections to enable appropriate communications among the aforementioned components.

I/O adapter 403 can further include a display adapter coupled to one or more displays. I/O adapter 403 can be configured to operatively connect one or more input/output (I/O) devices 407 to computer 400. For example, I/O 403 can connect a keyboard and mouse, a touchscreen, a speaker, a haptic output device, or other output device. Output devices 407 can include but are not limited to a printer, a scanner, and/or the like. Other output devices can also be included, although not shown. Finally, the I/O devices connectable to I/O adapter 403 can further include devices that communicate both inputs and outputs, for instance but not limited to, a network interface card (NIC) or modulator/ demodulator (for accessing other files, devices, systems, or a network), a radio frequency (RF) or other transceiver, a telephonic interface, a bridge, a router, and the like.

According to some embodiments, computer 400 can include a mobile communications adapter 423. Mobile communications adapter 423 can include GPS, cellular, mobile, and/or other communications protocols for wireless communication.

In some embodiments, computer 400 can further include communications adapter 416 for coupling to a network 406.

Network 406 can be an IP-based network for communication between computer 400 and any external device. Network 406 transmits and receives data between computer 400 and devices and/or systems external to computer 400. In an exemplary embodiment, network 406 can be a managed IP network administered by a service provider. Network 406 can be a network internal to an aircraft, such as, for example, an avionics network, etc. Network 406 can be implemented in a wireless fashion, e.g., using wireless protocols and technologies, such as WiFi, WiMax, etc. Network 406 can also be a wired network, e.g., an Ethernet network, an ARINC 429 network, a controller area network (CAN), etc., having any wired connectivity including, e.g., an RS232 connection, R5422 connection, etc. Network 406 can also be a packet-switched network such as a local area network, wide area network, metropolitan area network, Internet network, or other similar type of network environment. The network 406 can be a fixed wireless network, a wireless local area network (LAN), a wireless wide area network (WAN) a personal area network (PAN), a virtual private network (VPN), intranet or other suitable network system.

Network 406 can operatively connect computer 400 to one or more devices including device 417, device 418, and device 420. Network 406 can also connect computer 400 to one or more servers such as, for example, server 419.

If computer 400 is a PC, workstation, laptop, tablet computer and/or the like, the instructions in the memory 402 can further include a basic input output system (BIOS) (omitted for simplicity). The BIOS is a set of routines that initialize and test hardware at startup, start operating system 411, and support the transfer of data among the operatively connected hardware devices. The BIOS is typically stored in ROM 410 so that the BIOS can be executed when computer 400 is activated. When computer 400 is in operation, processor 401 can be configured to execute instructions stored within the memory 402, to communicate data to and from the memory 402, and to generally control operations of the computer 400 pursuant to the instructions.

The present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system for reducing low cycle fatigue of a soldered connection comprising:
    a controller;
    a heating element operatively connected to the controller and affixed to an electronic component; and
    a printed wire board (PWB) soldered in connection with an electronic component, and a trace heater embedded in the PWB, and another heating element operatively connected to the controller and affixed to an external portion of the PWB;
    wherein the controller is configured to:
    get from a temperature sensor a signal indicative of a temperature of the electronic component;
    compare the temperature to a stored predetermined range of operating temperatures, wherein the stored predetermined range is stored in a non-transitory memory;
    responsive to determining that the temperature of the electronic component is less than a lower threshold temperature of the predetermined range of operating temperatures, transmit a signal to the heating element, the another heating element and/or the trace heater, to raise the temperature of the electronic component and reduce a magnitude of the temperature difference (dT); and
    save, to an operatively connected computer readable memory, the magnitude of temperature difference and a number of times that magnitude is reached;
    retrieve, from the computer readable memory, a stored value indicative of an expected component life of the electronic component and PWB;
    evaluate, based on the magnitude of temperature difference (dT), the number of times (N) that magnitude is reached, and the stored value, a new cumulative value of a low cycle fatigue (LCF) to predict a remaining component life; and
    output an alert when the new cumulative value of the LCF exceeds a stored value of expected component life.

2. The system of claim 1, wherein the controller causes the heating element to raise the temperature of the electronic component with a steady state signal.

3. The system of claim 1, wherein the controller causes the heating element to raise the temperature of the electronic component with a signal pulse having a predetermined frequency and amplitude based on the temperature of the electronic component and the stored predetermined range of operating temperatures.

4. A computer-implemented method for reducing low cycle fatigue (LCF) in a soldered connection comprising:
    getting, from a temperature sensor via a processor in a controller, a signal indicative of a temperature of an electronic component soldered to a printed wire board (PWB);
    comparing, via the processor, the temperature to a stored predetermined range of operating temperatures, wherein the stored predetermined range is stored in a non-transitory memory;
    responsive to determining that the temperature of the electronic component is less than a lower threshold temperature of the predetermined range of operating temperatures, transmitting, via the processor, a signal to one or more of a heating element affixed to the electronic component, a trace heater embedded in the PWB, and another heating element affixed to an external portion of the PWB, to raise the temperature of the electronic component and reduce a magnitude of the temperature difference (dT); and
    saving, via the processor, to an operatively connected computer readable memory, the magnitude of temperature difference and a number of times that magnitude is reached;
    retrieving, from the computer readable memory, a stored value indicative of an expected component life of the electronic component and PWB;
    evaluating, based on the magnitude of temperature difference (dT), the number of times (N) that magnitude is reached, and the stored value, a new cumulative value of a low cycle fatigue (LCF) to predict a remaining component life; and
    outputting an alert when the new cumulative value of the exceeds a stored value of expected component life.

5. The method of claim 4, wherein the processor causes the heating element to raise the temperature of the electronic component with a steady state signal.

6. The method of claim 4, wherein the controller causes the heating element to raise the temperature of the electronic component with a signal pulse having a predetermined frequency and amplitude based on the temperature of the electronic component and the stored predetermined range of operating temperatures.

7. A computer program product for reducing low cycle fatigue, the computer program product comprising a computer readable storage medium having program instructions embodied therewith, the program instructions executable by a processor to cause the processor to perform a method comprising:
    getting, from a temperature sensor via processor, a signal indicative of a temperature of an electronic component soldered to a printed wire board (PWB);
    comparing, via the processor, the temperature to a stored predetermined range of operating temperatures, wherein the stored predetermined range is stored in a non-transitory memory;
    responsive to determining that the temperature of the electronic component is less than a lower threshold temperature of the predetermined range of operating temperatures, transmitting, via the processor, a signal to one or more of a heating element affixed to the electronic component, a trace heater embedded in the PWB, and another heating element affixed to an external portion of the PWB, to raise the temperature of the electronic component and reduce a magnitude of the temperature difference (dT); and
    saving, via the processor, to an operatively connected computer readable memory, the magnitude of temperature difference and a number of times that magnitude is reached;
    retrieving, from the computer readable memory, a stored value indicative of an expected component life of the electronic component and PWB;

evaluating, based on the magnitude of temperature difference (dT), the number of times (N) that magnitude is reached, and the stored value, a new cumulative value of a low cycle fatigue (LCF) to predict a remaining component life; and outputting an alert when the new cumulative value of the LCF exceeds a stored value of expected component life.

8. The computer program product of claim 7, wherein the processor causes the heating element to raise the temperature of the electronic component with a steady state signal.

9. The computer program product of claim 7, wherein the processor causes the heating element to raise the temperature of the electronic component with a signal pulse having a predetermined frequency and amplitude based on the temperature of the electronic component and the stored predetermined range of operating temperatures.

* * * * *